United States Patent
Ji et al.

(10) Patent No.: US 11,030,099 B2
(45) Date of Patent: Jun. 8, 2021

(54) DATA STORAGE APPARATUS AND OPERATING METHOD THEREOF

(71) Applicant: SK hynix Inc., Gyeonggi-do (KR)

(72) Inventors: Seung Gu Ji, Seoul (KR); Seok Jin Joo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 36 days.

(21) Appl. No.: 16/192,455

(22) Filed: Nov. 15, 2018

(65) Prior Publication Data

US 2019/0332530 A1   Oct. 31, 2019

(30) Foreign Application Priority Data

Apr. 27, 2018  (KR) .......................... 10-2018-0049249

(51) Int. Cl.
*G06F 12/0804* (2016.01)
*G11C 16/30* (2006.01)
*G11C 16/10* (2006.01)
*G11C 11/56* (2006.01)
*G11C 16/04* (2006.01)

(52) U.S. Cl.
CPC ...... *G06F 12/0804* (2013.01); *G11C 11/5628* (2013.01); *G11C 16/10* (2013.01); *G11C 16/30* (2013.01); *G06F 2212/1032* (2013.01); *G06F 2212/205* (2013.01); *G11C 16/0483* (2013.01)

(58) Field of Classification Search
USPC .......................................... 714/704; 711/103
See application file for complete search history.

(56) References Cited

U.S. PATENT DOCUMENTS

| | | | |
|---|---|---|---|
| 2008/0219057 A1* | 9/2008 | Li ....................... | G11C 16/0483 365/185.22 |
| 2014/0304560 A1* | 10/2014 | Narasimha .......... | G06F 13/1657 714/704 |
| 2016/0012904 A1* | 1/2016 | Sabde ................ | G11C 16/0466 365/185.02 |
| 2017/0287568 A1* | 10/2017 | Yang .................. | G11C 16/3431 |

FOREIGN PATENT DOCUMENTS

| | | |
|---|---|---|
| KR | 1020150039000 | 4/2015 |
| KR | 101608679 | 4/2016 |

OTHER PUBLICATIONS

Sheldon, Douglas; Michael Freie. Disturb Testing in Flash Memories. Pasadena, California: Jet Propulsion Laboratory, California Institute of Technology (2008) (Year: 2008).*

* cited by examiner

*Primary Examiner* — Michael Krofcheck
*Assistant Examiner* — John Francis Wojton
(74) *Attorney, Agent, or Firm* — IP & T Group LLP

(57) ABSTRACT

A data storage apparatus includes a nonvolatile memory device including a plurality of memory blocks in which a plurality of word lines to which one or more pages are coupled are arranged, a data buffer configured to buffer data to be stored in the one or more pages of the nonvolatile memory device, and a processor configured to detect, when a sudden power off (SPO) occurs, one or more first pages in which an interference has occurred in a memory block in use and store data corresponding to the one or more first pages in which the interference has occurred among the data buffered in the data buffer in a backup memory block of the nonvolatile memory device.

18 Claims, 17 Drawing Sheets

| PAGE NO. | WRITE OPERATION SEQUENCE |
|---|---|
| PG11 | 1 |
| PG12 | 2 |
| PG21 | 3 |
| PG22 | 4 |
| PG31 | 5 |
| PG32 | 6 |
| PG41 | 7 |
| PG42 | 8 |

| PAGE NO. | WRITE OPERATION SEQUENCE | |
|---|---|---|
| | FIRST WRITE | SECOND WRITE |
| PG11 | 1 | 5 |
| PG12 | 2 | 6 |
| PG21 | 3 | 9 |
| PG22 | 4 | 10 |
| PG31 | 7 | 13 |
| PG32 | 8 | 14 |
| PG41 | 11 | |
| PG42 | 12 | |

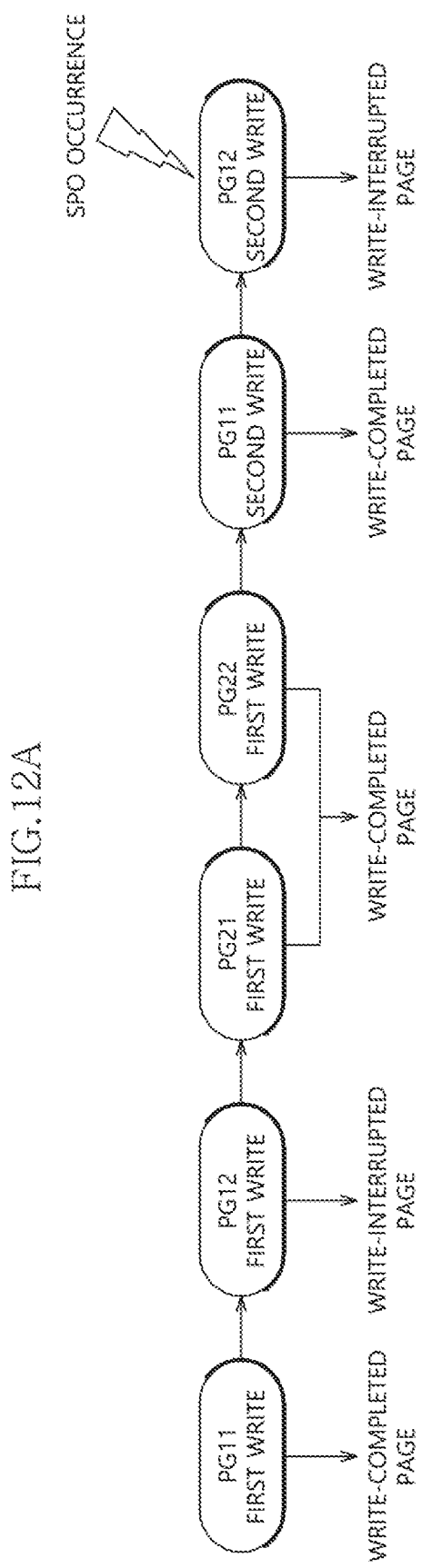

DATA STORAGE APPARATUS AND OPERATING METHOD THEREOF

CROSS-REFERENCE TO RELATED APPLICATION

The present application claims priority under 35 U.S.C. § 119(a) to Korean application number 10-2018-0049249, filed on Apr. 27, 2018, the disclosure of which is incorporated herein by reference in its entirety.

BACKGROUND

1. Technical Field

Various embodiments of the present invention may generally relate to a semiconductor apparatus. Particularly, the embodiments relate to a data storage apparatus and an operating method thereof.

2. Related Art

The computer environment paradigm has recently shifted to ubiquitous computing, which enables computer systems to be used anytime and anywhere. As a result, use of portable electronic apparatuses such as a mobile phone, a digital camera, and a laptop computer has been increasing rapidly. Generally, portable electronic apparatuses use data storage apparatuses that employ memory devices. Data storage apparatuses may be used to store data used in the portable electronic apparatuses.

Such data storage apparatuses using memory devices have excellent stability and endurance, high information access rate, and low power consumption, since they have no mechanical driving units. Such data storage apparatuses may include a universal serial bus (USB) memory device, a memory card having various interfaces, a universal flash storage (UFS) device, a solid state drive (SSD), and the like.

SUMMARY

Embodiments are provided to a data storage apparatus capable of efficiently performing data backup and an operating method thereof.

In an embodiment of the present disclosure, a data storage apparatus may include: a nonvolatile memory device including a plurality of memory blocks in which a plurality of word lines to which one or more pages are coupled are arranged; a data buffer configured to buffer data to be stored in the one or more pages of the nonvolatile memory device; and a processor configured to detect, when a sudden power off (SPO) occurs, one or more first pages in which an interference has occurred in a memory block in use, and store data corresponding to the one or more first pages in which the interference has occurred among the data buffered in the data buffer in a backup memory block of the nonvolatile memory device.

In an embodiment of the present disclosure, an operating method of a data storage apparatus, the method may include: detecting occurrence of sudden power-off (SPO) of the data storage apparatus; detecting one or more first pages in which an interference has occurred within a memory block in use; and storing data corresponding to the one or more first pages among data buffered in a data buffer in a backup memory block of a nonvolatile memory device.

In an embodiment of the present disclosure, a memory system may include: a memory block including page planes arranged in a first direction, each coupled to a word line and each having pages arranged in a second direction, each page having quadruple level cells (QLCs) arranged in a third direction; and a controller configured to back up, when a sudden power off (SPO) occurs during one or more program operations to the memory block, buffered data to be programmed into one or more between interrupted and interfered pages of the memory block. The interrupted page is a page to which the program operation is interrupted due to the SPO, and the interfered page is a page within a page plane, which is arranged adjacent to a page plane of the interrupted page and to which program operations are completed before the interrupted program operation.

According to embodiments, only partial data corresponding to the pages, in which interference is generated, among data buffered in a data buffer may be stored in the nonvolatile memory device under the SPO situation and thus a size of data to be backed up may be reduced.

As the size of the data to be backed up is reduced, the data backup may be stably completed while a minimal operation power is maintained through a power loss protection (PLP) circuit and thus the number of capacitors for providing the minimal operation power may be reduced and the manufacturing cost of the device may be reduced.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 8A to 12B are conceptual diagrams illustrating a process of backing up partial data among data temporarily stored in a data buffer in sudden power-off (SPO) according to an embodiment of the present disclosure;

DETAILED DESCRIPTION

Figure 1:
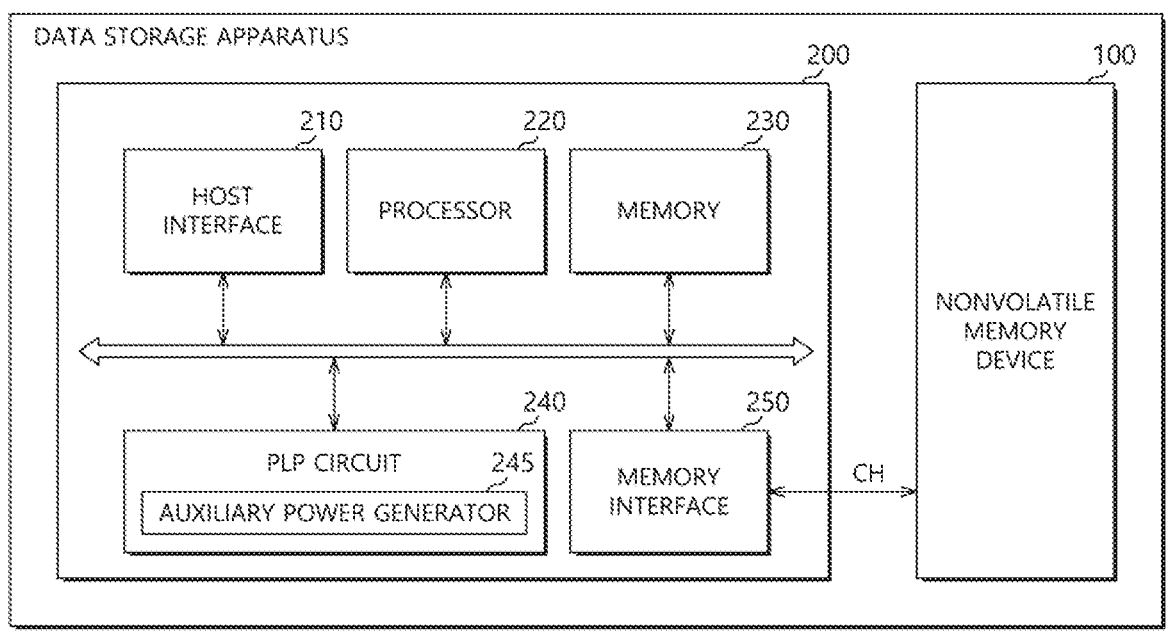
FIG. 1 is a block diagram illustrating a configuration example of a data storage apparatus according to an embodiment of the present disclosure.

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims. It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

Figure 2:
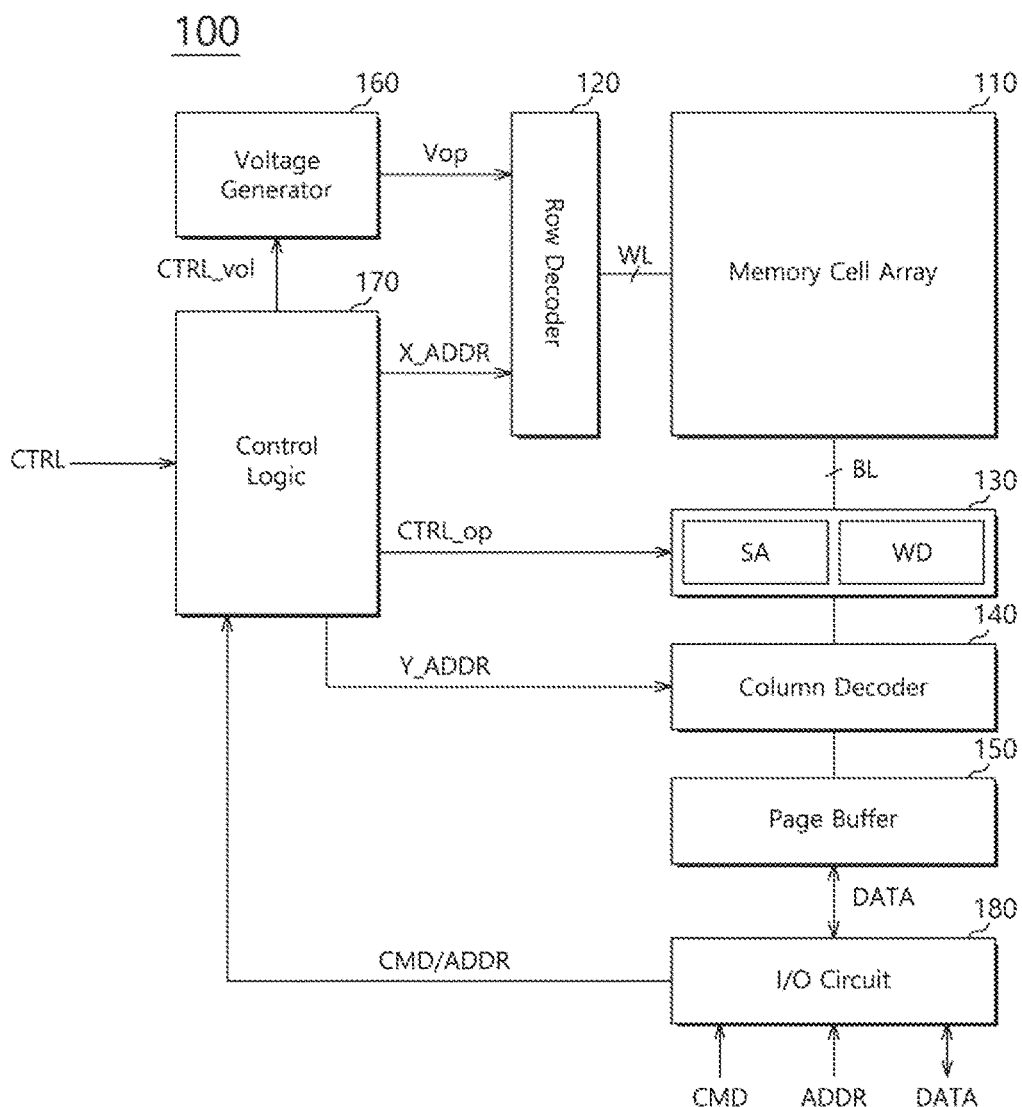
FIG. 2 is a diagram illustrating a configuration example of a nonvolatile memory device of FIG. 1.
Figure 3:
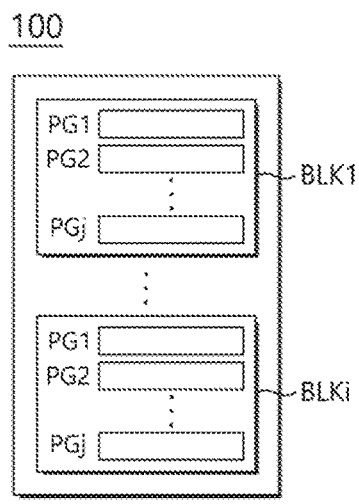
FIG. 3 is a diagram illustrating a configuration example of a memory cell array of FIG. 2.

FIG. 1 is a block diagram illustrating a configuration example of a data storage apparatus 10 according to an embodiment. FIG. 2 is a diagram illustrating a configuration example of the nonvolatile memory device 100 of FIG. 1. FIG. 3 is a diagram illustrating a configuration example of a memory cell array 110 of FIG. 2.

Referring to FIG. 1, a data storage apparatus 10 according to the embodiment may store data to be accessed by a host apparatus (not shown) such as a mobile phone, an MP3 player, a laptop computer, a desktop computer, a game player, a television (TV), or an in-vehicle infotainment system, and the like. The data storage apparatus 10 may refer to a memory system.

The data storage apparatus 10 may be manufactured as any one among various types of storage apparatuses according to an interface protocol coupled to a host apparatus (not shown). For example, the data storage apparatus 10 may be configured as any one of various types of storage apparatuses, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) card type storage device, a compact flash (CF) card, a smart media card, a memory stick, and the like.

The data storage apparatus 10 may be manufactured as any one among various types of packages. For example, the data storage apparatus 10 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The data storage apparatus 10 may include a nonvolatile memory device 100 and a controller 200.

The nonvolatile memory device 100 may be operated as a storage medium of the data storage apparatus 10. By way of example and not limitation, the nonvolatile memory device 100 may include any one of various types of nonvolatile memory devices according to a memory cell, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (ReRAM) using a transition metal compound.

Referring to FIG. 2, the nonvolatile memory device 100 may include a memory cell array 110, a row decoder 120, a read/write circuit 130, a column decoder 140, a page buffer 150, a voltage generator 160, a control logic 170, and an input/output (I/O) circuit 180.

The memory cell array 110 may include a plurality of memory cells (not shown) arranged in regions in which a plurality of word lines WL and a plurality of bit lines BL cross each other.

Referring to FIG. 3, the memory cell array 110 may include a plurality of memory blocks BLK1 to BLKi and each of the plurality of memory blocks BLK1 to BLKi may include a plurality of pages PG1 to PGj.

By way of example and not limitation, each of the memory cells in the memory cell array 110 may be at least one among a single level cell (SLC) in which a single bit data (for example, 1-bit data) is to be stored, a multilevel cell (MLC) in which 2-bit data is to be stored, a triple level cell (TLC) in which 3-bit data is to be stored, and a quad level cell QLC in which 4-bit data is to be stored. The memory cell array 110 may include at least one or more cells among the SLC, the MLC, the TLC, and the QLC. For example, the memory cell array 110 may include memory cells having a two-dimensional (2D) horizontal structure or memory cells having a 3D vertical structure.

Referring back to FIG. 2, the row decoder 120 may be coupled to the memory cell array 110 through the word lines WL. The row decoder 120 may be operate according to control of the control logic 170. The row decoder 120 may decode a row address X-ADDR provided from the control logic 170 and select and drive at least one among the word lines WL based on a decoding result. The row decoder 120 may provide an operation voltage Vop provided from the voltage generator 160 to the selected word line WL.

The read/write circuit 130 may be coupled to the memory cell array 110 through the bit lines BL. The read/write circuit 130 may include read/write circuits (not shown) corresponding to the bit lines BL. The read/write circuit 130 may operate according to control of the control logic 170. The read/write circuit 130 may include a write driver WD configured to write data in memory cells and a sense amplifier SA configured to amplify data read out from the memory cell. The read/write circuit 130 may perform write and read operations on selected memory cells by providing a current pulse or a voltage pulse to the memory cells selected through the row decoder 120 and the column decoder 140 among the memory cells of the memory cell array 110.

The column decoder 140 may be operate according to control of the control logic 170. The column decoder 140 may decode a column address Y-ADDR provided from the control logic 170. The column decoder 140 may couple the read/write circuits of the read/write circuit 130 corresponding to the bit lines BL and the page buffer 150 according to the decoding result.

The page buffer 150 may be configured to temporarily store write data which is provided from a memory interface 250 of the controller 200 and is to be written in the memory cell array 110 or read data which is read out from the memory cell array 110 and is to be transmitted to the memory interface 250 of the controller 200. The page buffer 150 may be operated according to control of the control logic 170.

The voltage generator 160 may generate various voltages for performing write, read, and erase operations on the memory cell array 110 based on a voltage control signal CTRL_vol provided from the control logic 170. The voltage generator 160 may generate driving voltages flop for driving a plurality of word lines WL and a plurality of bit lines BL. The voltage generator 160 may generate at least one or more reference voltages for reading data stored in memory cells MC.

The control logic 170 may output various control signals for writing data DATA in the memory cell array 110 or reading out data DATA from the memory cell array 110 based on a command CMD, an address ADDR, and a control signal CTRL received from the controller 200 show in FIG. 1. The various control signals output from the control logic 170 may be provided to the row decoder 120, the write/read circuit 130, the column decoder 140, the page buffer 150, and the voltage generator 160. Accordingly, the control logic 170 may control overall operations performed in the nonvolatile memory device 100.

For example, the control logic 170 may generate the operation control signal CTRL_op based on the command CMD and the control signal CTRL and provide the generated operation control signal CTRL_op to the write/read circuit 130. The control logic 170 may provide the row address X_ADDR and the column address Y_ADDR included in the address ADDR to the row decoder 120 and the column decoder 140.

The I/O circuit 180 may be configured to receive the command CMD, the address ADDR, and the data DATA provided from the controller 200 or provide the data DATA read out from the memory cell array 110 to the controller 200. The I/O circuit 180 may output the command CMD and the address ADDR received from the controller 200 to the control logic 170 and output the data DATA to the page buffer 150. The I/O circuit 180 may output the data DATA received from the page buffer 150 to the controller 200. The I/O circuit 180 may be operated according to control of the control logic 170.

Referring back to FIG. 1, the controller 200 may control an overall operation of the data storage apparatus 10 through driving of firmware or software loaded into the memory 230. The controller 200 may decode and drive a code-type instruction or algorithm such as firmware or software. The controller 200 may be implemented in hardware, or may be implemented in a combination of hardware and software.

The controller 200 may include a host interface 210, a processor 220, a memory 230, a power loss protection (PLP) circuit 240, and the memory interface 250. The PLP circuit 240 may include an auxiliary power generator 245.

The host interface 210 may perform interfacing between a host apparatus and the data storage apparatus 10 according to a protocol of the host apparatus. For example, the host interface 210 may communicate with the host apparatus through any one among protocols such as a USB protocol, a UFS protocol, an MMC protocol, a parallel advanced technology attachment (DATA) protocol, a serial advanced technology attachment (SATA) protocol, a small computer system interface (SCSI) protocol, a serial attached SCSI (SAS) protocol, a PCI protocol, and a PCI-E protocol.

The processor 220 may be configured of a micro-control unit (MCU) and a central processing unit (CPU). The processor 220 may process a request transmitted from a host apparatus. To process the request transmitted from the host apparatus, the processor 220 may drive the code-type instruction or algorithm, for example, firmware loaded into the memory 230 and control internal functional blocks thereof such as the host interface 210, the memory 230, the PLP circuit 240, and the memory interface 250 and the nonvolatile memory device 100.

The processor 220 may generate control signals for controlling an operation of the nonvolatile memory device 100 based on requests transmitted from a host apparatus and provide the generated control signals to the nonvolatile memory device 100 through the memory interface 250.

The memory 230 may be configured of a random access memory such as a dynamic RAM (DRAM) or a static RAM (SRAM). The memory 230 may store firmware driven through the processor 220. The memory 230 may store data (for example, meta data) required for driving of the firmware. For example, the memory 230 may operate as a working memory of the processor 220.

The memory 230 may be configured to include a data buffer (DB) (not shown) configured to temporarily store data to be transmitted from a host apparatus to the nonvolatile memory device 100 or data to be transmitted from the nonvolatile memory device 100 to the host apparatus. For example, the memory 230 may operate as a buffer memory.

The PLP circuit 240 may supply auxiliary power to the data storage apparatus 10 to stably terminate the operations performing in the data storage apparatus 10 when the power supplied to the data storage apparatus 10 is abruptly interrupted (for example, due to a sudden power off (SPO)). Although FIG. 1 illustrates, as an example and for convenience in description, that the PLP circuit 240 includes the auxiliary power generator 245 that is configured to generate the auxiliary power, the present invention is not limited thereto. For example, the auxiliary power generator 245 may not be included in the PLP circuit 240, and may be provided inside or outside of the controller 200.

The auxiliary power generator 245 may be configured of a capacitor module (not shown) including one or more capacitors, but the auxiliary power generator is not limited thereto.

For example, when the SPO occurs during the write operation of storing data in memory cells of the nonvolatile memory device 100 according to a write request from a host apparatus, the PLP circuit 240 may provide the minimum operating power (that is, minimum power needed to operate) to the data storage apparatus 10 using the auxiliary power generator 245 to perform a backup operation of storing data temporarily stored in the data buffer DB of the memory 230 in the nonvolatile memory device 100.

As the capacity of the nonvolatile memory device 100 is gradually increased, the size of data stored in one memory cell may also be gradually increased. Recently, there has been an increase in use of a quadruple level cell (QLC) method that stores four-bit data in one memory cell.

Due to high integration of the memory cell array 110, an interval between the signal lines (for example, bit lines and word lines) may be reduced. Due to the reduction in the intervals, interference may be generated in another word line (for example, a word line in which a write operation on the data is completed) close to a word line on which the write operation is performing and thus the data stored in the corresponding word line may be damaged.

To solve these issues, when storing data into the QLC array, a first-first write operation which stores first data in first memory cells coupled to a first word line among a plurality of word lines may be performed, a second-first write operation which stores second data in second memory cells coupled to next word line (for example, second word line) close to the first word line may be performed, and a first-second write operation which stores the first data in the first memory cells of the first word line again may be performed. The first data stored by the first-first write operation may be the same as the first data stored by the first-second write operation.

According to the above-described QLC storage scheme, the amount of data buffered in the data buffer DB of the memory 230 may be increased and all the data stored in the data buffer DB may not be backed up to the nonvolatile memory device 100 while the minimum operating power provided through the PLP circuit 240 is maintained under the SPO situation. To increase the maintenance time of the minimum operating power provided from the PLP circuit 240, one solution may be to increase the number of capacitors included in the auxiliary power generator 245. However, such a method may cause the cost to increase due to the increase in the number of capacitors.

Accordingly, in the embodiment, a method of efficiently performing the PLP operation may be provided without increase in the number of capacitors included in the auxiliary power generator 245. The method of performing the PLP operation will be described later in detail with reference to the drawings.

The memory interface 250 may control the nonvolatile memory device 100 according to control of the processor 220. The memory interface 250 may refer to a memory controller. The memory interface 250 may provide control signals to the nonvolatile memory device 100. The control signals may include the command CMD, the address ADDR, the operation control signal CTRL, and the like for controlling the nonvolatile memory device 100. The memory interface 250 may provide the data DATA to the nonvolatile memory device 100 or receive the data DATA from the nonvolatile memory device 100.

Figure 4A:
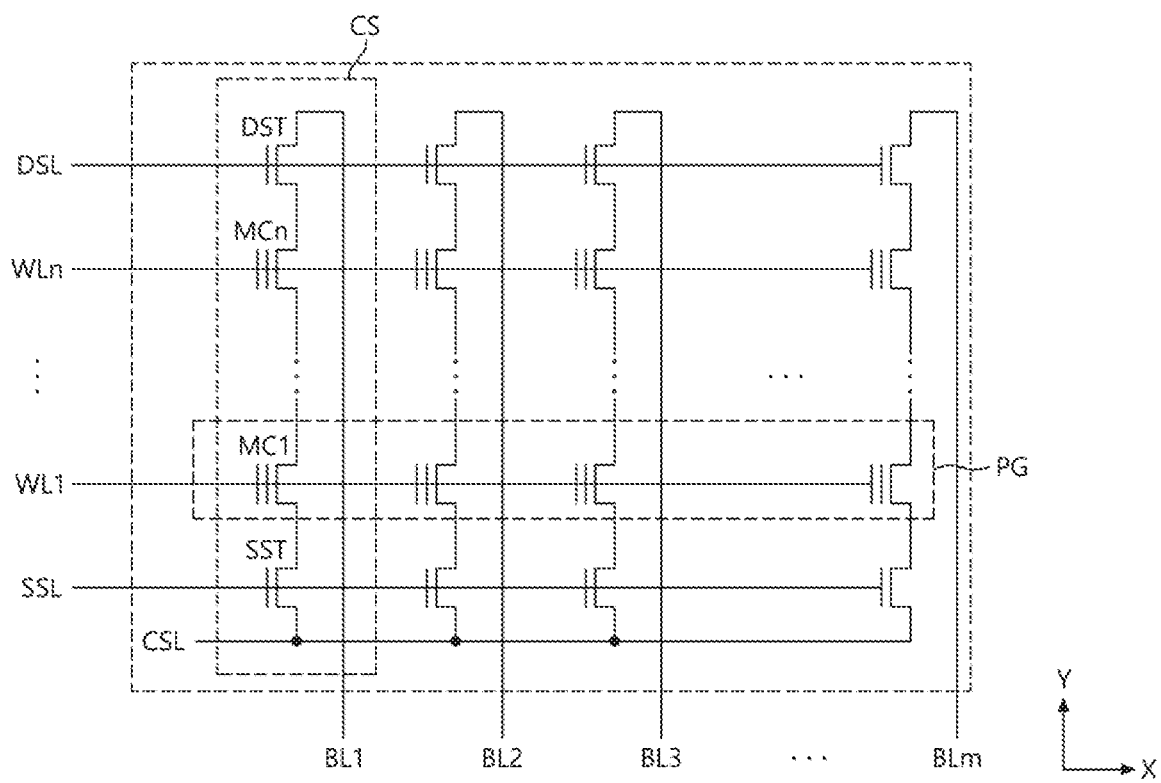
FIGS. 4A and 4B are circuit diagrams illustrating implementation examples of a memory block of FIG. 2.
Figure 4B:
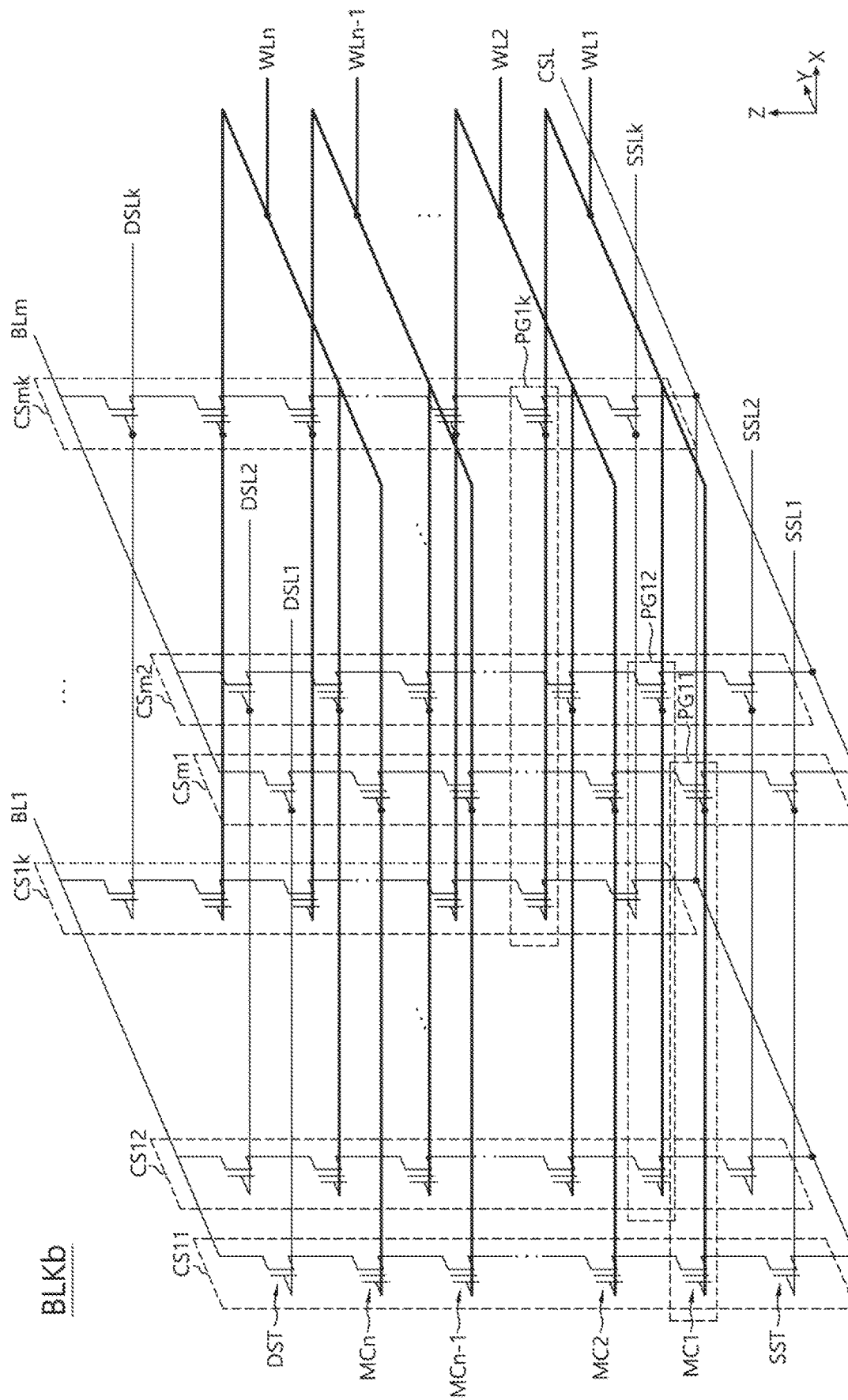

FIGS. 4A and 4B are circuit diagrams illustrating an example of a memory block among the plurality of memory blocks shown in FIG. 3. Specifically, FIG. 4A is a circuit diagram illustrating a memory block BLKa including memory cells arranged in a 2D manner and FIG. 4B is a circuit diagram illustrating a memory block BLKb including memory cells arranged in a 3D manner. As illustrated in FIG. 3, the memory cell array 110 may include the plurality of memory blocks BLK1 to BLKi and each of the memory blocks BLK1 to BLKi may be implemented with the circuit illustrated in FIG. 4A or 4B, but this is not limited thereto.

Referring to FIG. 4A, the memory block BLKa may have a 2D horizontal structure. The memory block BLKa of FIG. 4A may correspond to any one among the plurality of memory blocks BLK1 to BLKi shown in FIG. 3. The memory block BLKa may include a plurality of bit lines BL1 to BLm arranged in a first direction and a plurality of word lines WL1 to WLn arranged a second direction. The first direction may be an X-direction and the second direction may be a Y-axis direction, but this is not limited thereto. The first direction may be the Y-axis direction and the second direction may be the X-direction.

The memory block BLKa may include a plurality of cell strings CS coupled to the plurality of bit lines BL1 to BLm. Each of the cell strings CS may have the same configuration as each other. For convenience of description and illustrative purposes, one cell string CS will be described below.

The cell string CS may include a plurality of memory cells MC1 to MCn and select transistors DST and SST coupled between the bit line BL1 and a common source line CSL. For example, the cell string CS may include a drain select transistor DST coupled to a drain select line DSL, the plurality of memory cells MC1 to MCn coupled to the plurality of word lines WL1 to WLn, and a source select transistor SST coupled to a source select line SSL.

As illustrated in FIG. 4A, a plurality of memory cells coupled to the same word line may refer to a page PG unit. The write operation and the read operation for the plurality of memory cells coupled to the same word line may be simultaneously performed, but this is not limited thereto.

Referring to FIG. 4B, the memory block BLKb may have a 3D vertical structure. The memory block BLKb of FIG. 4B may correspond to any one among the plurality of memory blocks BLK1 to BLKi shown in FIG. 3.

The memory block BLKb may include a plurality of bit lines BL1 to BLm arranged to be spaced in a first direction, a plurality of cell strings CS11~CS1k to CSm1~CSmk coupled to the bit lines BL1 to BLm and arranged to be spaced in a second direction, and a plurality of word lines WL1 to WLn arranged to be spaced in a third direction. The first direction may be an X-direction, the second direction may be a Y-axis direction, and the third direction may be a Z-axis direction, but this is not limited thereto.

As k cell strings are coupled to each of m bit lines, m×k cell strings may be arranged in the memory block BLKb. Here, n, m, and k are integers greater than or equal to 1.

Each of the plurality of cell strings CS11~CS1k to CSm1~CSmk may include at least one source select transistor SST, first to n-th memory cells MC1 to MCn, and at least one drain select transistor DST. The source select transistor SST of each cell string may be coupled between a common source line CSL and the memory cell MC1.

The source select transistors SST of the cell strings arranged on the same line in the X-axis direction may be coupled to the same source select line. For example, the source select transistors SST of the plurality of first cell strings CS11 to CSm1 coupled to the bit lines BL1 to BLm may be coupled to the first source select line SSL1. Similarly, the source select transistors SST of the plurality of second to k-th cell strings CS12~CSm2 to CS1k~CSmk coupled to the bit lines BL1 to BLm may be coupled to the second to k-th source select lines SSL2 to SSLk.

The drain select transistors DST of the cell strings arranged on the same line in the X-axis direction may be coupled to the same drain select line. For example, the drain select transistors DST of the first cell strings CS11 to CSm1 coupled to the bit lines BL1 to BLm may be coupled to the first drain select line DSL1. Similarly, the drain select transistors DST of the plurality of second to k-th cell strings CS12~CSm2 to CS1k~CSmk coupled to the bit lines BL1 to BLm may be coupled to the second to k-th drain select lines DSL2 to DSLk.

The first to n-th memory cells MC1 to MCn of each of the plurality of cell strings CS11~CS1k to CSm1~CSmk may be coupled in series between the source select transistor SST and the drain select transistor DST.

The first to n-th memory cells MC1 to MCn of each of the plurality of cell strings CS11~CS1k to CSm1~CSmk may be coupled to the first to n-th word lines. The memory cells coupled to the cell strings arranged on the same line in the X-axis direction and coupled to the same word line may refer to the page unit.

For example, as illustrated in FIG. 4B, the first memory cells MC1 coupled to the first cell strings CS11 to CSm1 arranged on the same line in the X-axis direction and the first word line WL1 may refer to a first-first page PG11. Similarly, the first memory cells MC1 coupled to the second to k-th cell strings CS12~CSm2 to CS1k~CSmk arranged on the same line in the X-axis direction and the first word line WL1 may refer to first-second to first-k-th pages PG12 to PG1k. Although a plurality of pages are coupled to one word line in the 3D vertical structure illustrated in FIG. 4B, this is not limited thereto.

K pages may be coupled to each of the word lines WL1 to WLn and n×k pages may be arranged in the memory block BLKb. The number of pages in each of the word lines WL1 to WLn may be changed according to the number of cell strings coupled to the bit lines BL1 to BLm.

Hereinafter, an example of a write operation for a memory block having the 3D vertical structure illustrated in FIG. 4B will be described.

Figures 5A, 5B:
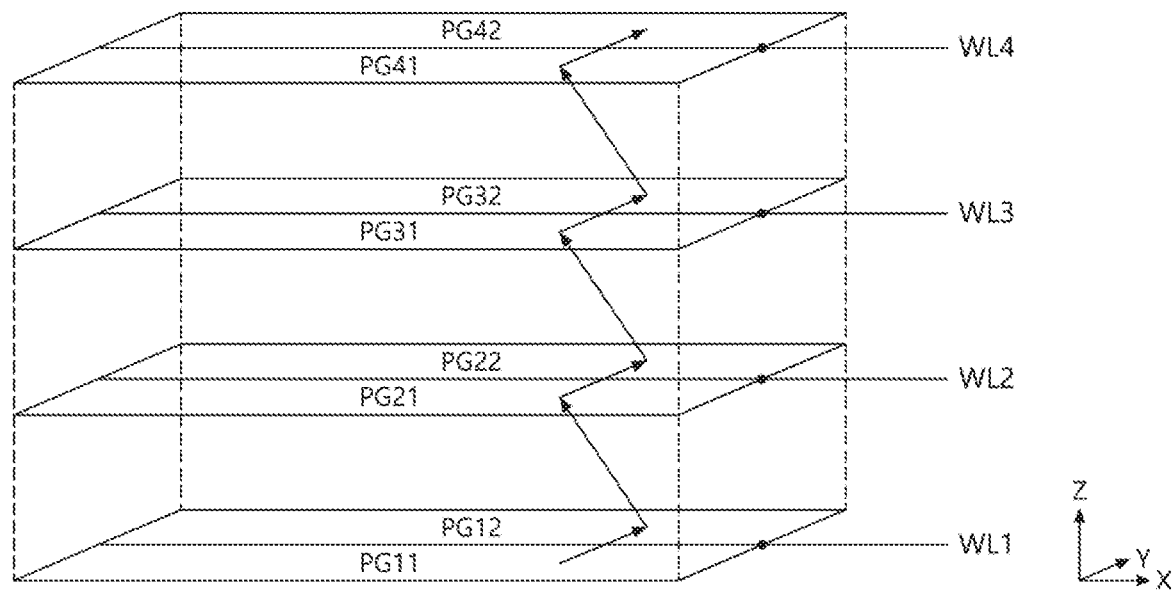
FIGS. 5A and 5B are diagrams illustrating an example of a program operation for memory cells having a three-dimensional (3D) vertical structure according to an embodiment of the present disclosure.

FIG. 5A is a diagram illustrating an example of a write operation for a memory block BLKo having the 3D vertical structure. FIG. 5B is a diagram illustrating a write operation sequence table according to pages of FIG. 5A. The memory block BLKo of FIG. 5A may correspond to any one among the plurality of memory blocks BLK1 to BLKi shown in FIG. 3.

Figure 6A:
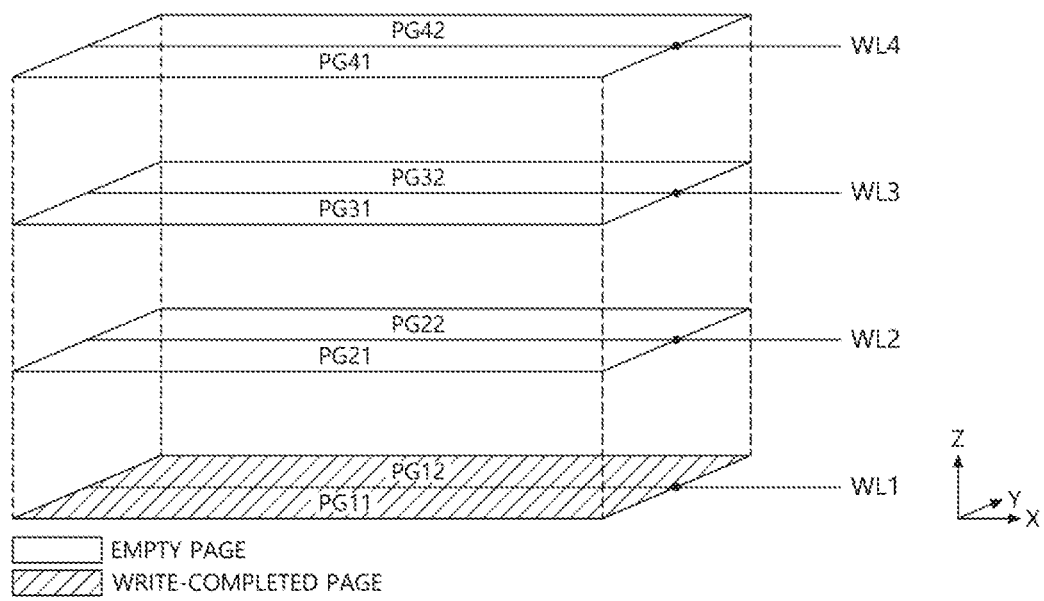
FIG. 6A is a conceptual diagram illustrating an example in which a write operation on pages coupled to a first word line among word lines vertically arranged is performed according to an embodiment of the present disclosure.
Figure 6B:
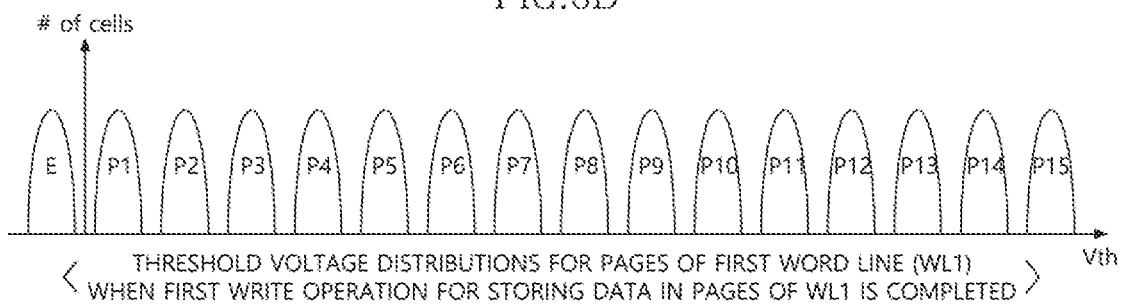
FIG. 6B is a graph illustrating a threshold voltage distribution for each of pages of a write-completed first word line according to an embodiment of the present disclosure.

FIG. 6A is a conceptual diagram illustrating a state in which a write operation is performed on the first-first page PG11 and the first-second page PG12 of the first word line WL1. FIG. 6B is a graph illustrating threshold voltage distributions for the first-first page PG11 and the first-second page PG12 of the write-completed first word line WL1 (that is, pages in which the write operation has been completed).

Figure 6C:
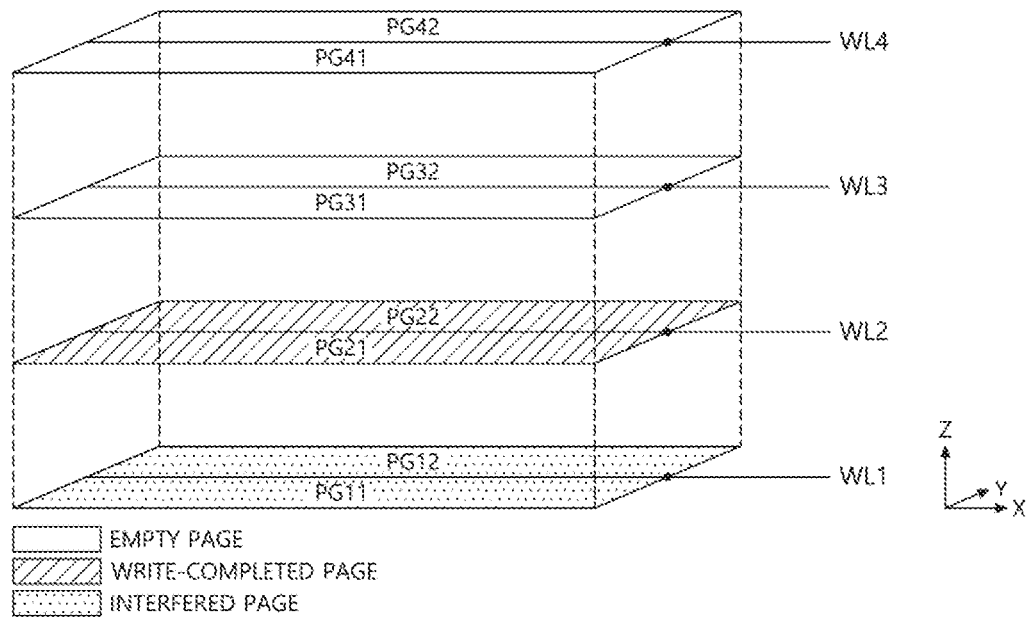
FIG. 6C is a conceptual diagram illustrating an example in which interference is generated in pages of a first word line as a write operation on pages coupled to a second word line is performed according to an embodiment of the present disclosure in FIG. 6A.
Figure 6D:
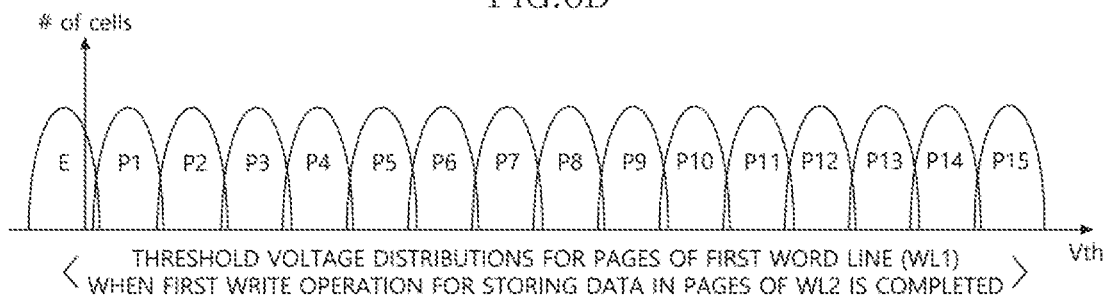
FIG. 6D is a graph illustrating threshold voltage distributions for each of pages of interfered first word line according to an embodiment of the present disclosure.
Figure 6E:
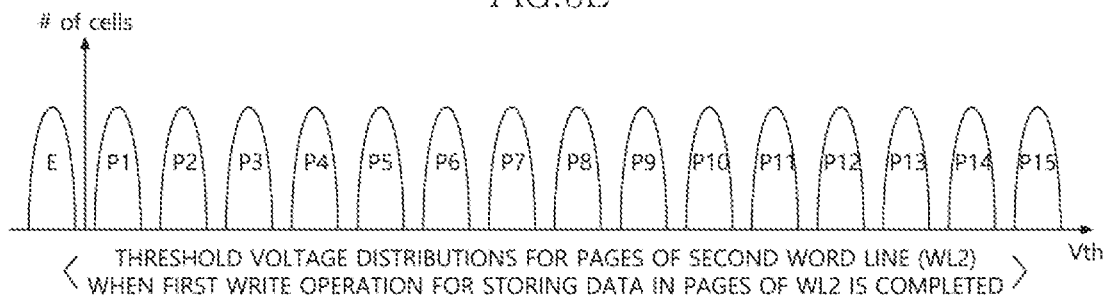
FIG. 6E is a graph illustrating threshold voltage distributions for each of pages of a write-completed second word line according to an embodiment of the present disclosure.

FIG. 6C is a conceptual diagram illustrating a state in which interference is generated in the first-first page PG11 and the first-second page PG12 of the first word line WL1 as a write operation is performed on the second-first page PG21 and the second-second page PG22 of the second word line WL2. FIG. 6D is a graph illustrating threshold voltage distributions for the first-first page PG11 and the first-second page PG12 of the interfered first word line WL1. FIG. 6E is a graph illustrating threshold voltage distributions for the second-first page PG21 and the second-second page PG22 of the write-completed second word line WL2. For convenience of description and illustrative purposes, it is assumed that the memory block BLKo includes four word lines WL1 to WL4 and two pages PG11 to PG42 are coupled to the word lines WL1 to WL4. However, the number of word lines and pages coupled to the word lines may vary depending on design.

Referring to FIGS. 5A and 5B, the write operation for the memory block BLKo may start from the first-first page PG11 of the first word line WL1 and may be terminated in a fourth-second page PG42 of the fourth word line WL4 as indicated by a solid arrow. For example, the write operation for the memory block BLKo may be performed in the following order: the first-first page PG11 of the first word line WL1, the first-second page PG12 of the first word line WL1, the second-first page PG21 of the second word line WL2, the second-second page PG22 of the second word line WL2, a third-first page PG31 of the third word line WL3, a third-second page PG32 of the third word line WL3, the fourth-first page PG41 of the fourth word line WL4, and a fourth-second page PG42 of the fourth word line WL4.

As the write operation is performed sequentially, first-first data and first-second data stored in the first-first page PG11 and the first-second page PG12 of the first word line WL1, second-first data and second-second data stored in the second-first page PG21 and the second-second page PG22 of the second word line WL2, third-first data and third-second data stored in the third-first page PG31 and the third-second page PG32 of the third word line WL3 may be interfered by the write operations for the second word line WL2, the third word line WL3, and the fourth word line WL4.

For example, when the first write operation for storing the first-first data and the first-second data in the first-first page PG11 and the first-second page PG12 of the first word line WL1 is completed as illustrated in FIG. 6A, the threshold voltage distributions for the first-first page PG11 and the first-second page PG12 of the first word line WL1 may be formed as illustrated in FIG. 6B. When the first write operation for storing the second-first data and the second-second data in the second-first page PG21 and the second-second page PG22 of the second word line WL2 is completed as illustrated in FIG. 6C, the threshold voltage distributions for the second-first page PG21 and the second-second page PG22 of the second word line WL2 may be formed as illustrated in FIG. 6E, but the threshold voltage distributions for the first-first page PG11 and the first-second page PG12 of the first word line WL1 may be deformed as illustrated in FIG. 6D. For example, when the first write operation for the second-first page PG21 and the second-second page PG22 of the second word line WL2 is performed, first-first data and the first-second data stored in the first-first page PG11 and the first-second page PG12 of the first word line WL1 close to the second word line WL2 may be interfered and thus the threshold voltage distribution may be deformed. Accordingly, the first-first data and the first-second data stored in the first-first page PG11 and the first-second page PG12 of the first word line WL1 may be damaged.

Figures 7A, 7B:
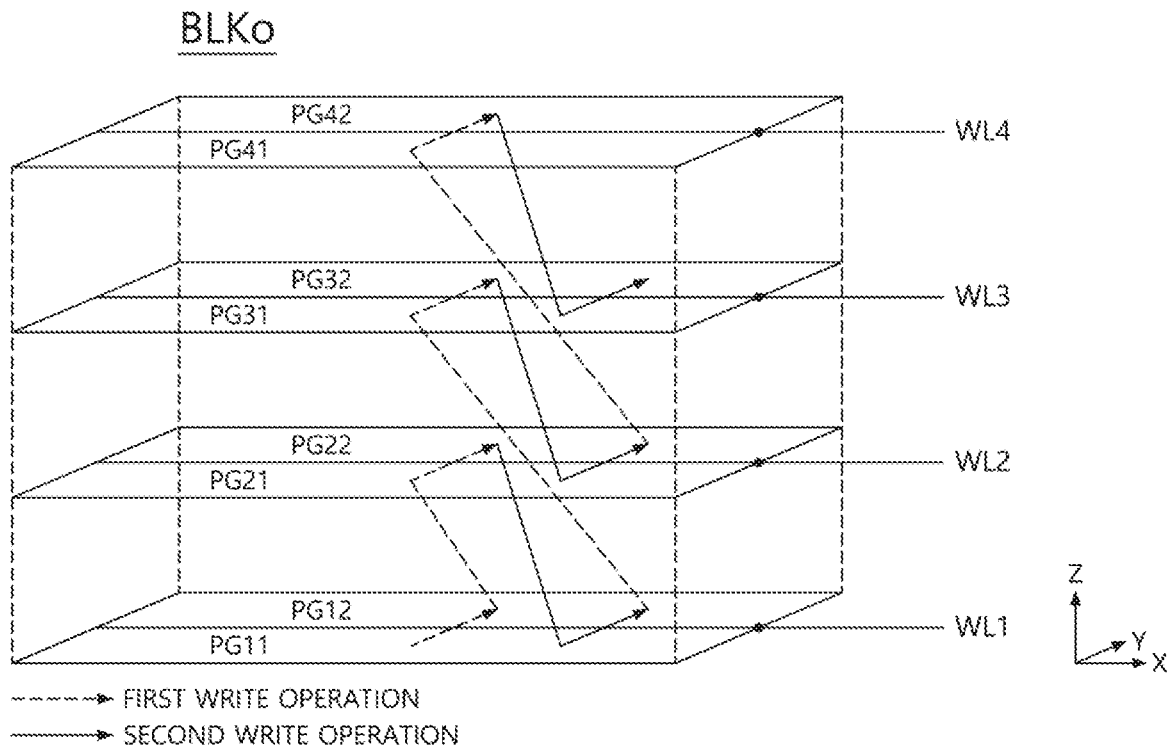
FIG. 7A is a diagram illustrating an example of a write operation according to an embodiment of the present disclosure.
FIG. 7B is a diagram illustrating a write operation sequence table according to a page of FIG. 7A according to an embodiment of the present disclosure.

In an embodiment of the present invention, the first write operation on one or more pages coupled to a specific word line (for example, first word line) may be performed, the first write operation on one or more pages coupled to next word line (for example, the second word line) close to the specific word line may be performed, and then the second write operation on the one or more pages coupled to the first word line may be performed. The above-described write operation method is illustrated in more detail below with references to FIGS. 7A and 7B. In FIG. 7A, the dotted arrow may indicate the first write operation and the solid arrow may indicate the second write operation.

Referring to FIGS. 7A and 7B, the write operation for the memory block BLKo may start from the first-first page PG11 of the first word line WL1 and may be terminated in the third-second page PG32 of the third word line WL3.

For example, the write operation for the memory block BLko may be performed in the following order: the first write operation for the first-first page PG11 and the first-second page PG12 of the first word line WL1, the first write operation for the second-first page PG21 and the second-second page PG22 of the second word line WL2, the second write operation for the first-first page PG11 and the first-second page PG12 of the first word line WL1, the first write operation for the third-first page PG31 and the third-second page PG32 of the third word line WL3, the second write operation for the second-first page PG21 and the second-second page PG22 of the second word line WL2, the first write operation for the fourth-first page PG41 and the fourth-second page PG42 of the fourth word line WL4, and the second write operation for the third-first page PG31 and the third-second page P32 of the third word line WL3. Accordingly, the first-first data to the fourth-second data for the first-first page PG11 to the fourth-second page PG42 of the first to fourth word lines WL1 to WL4 may be normally written.

Figure 8A:
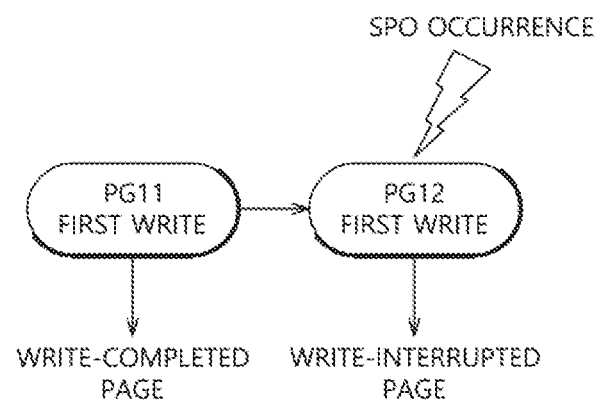
Figure 10A:
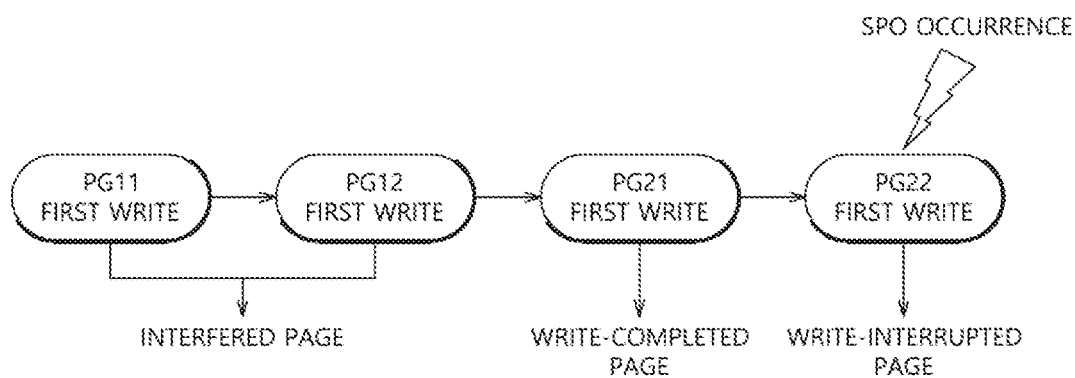
Figure 10B:
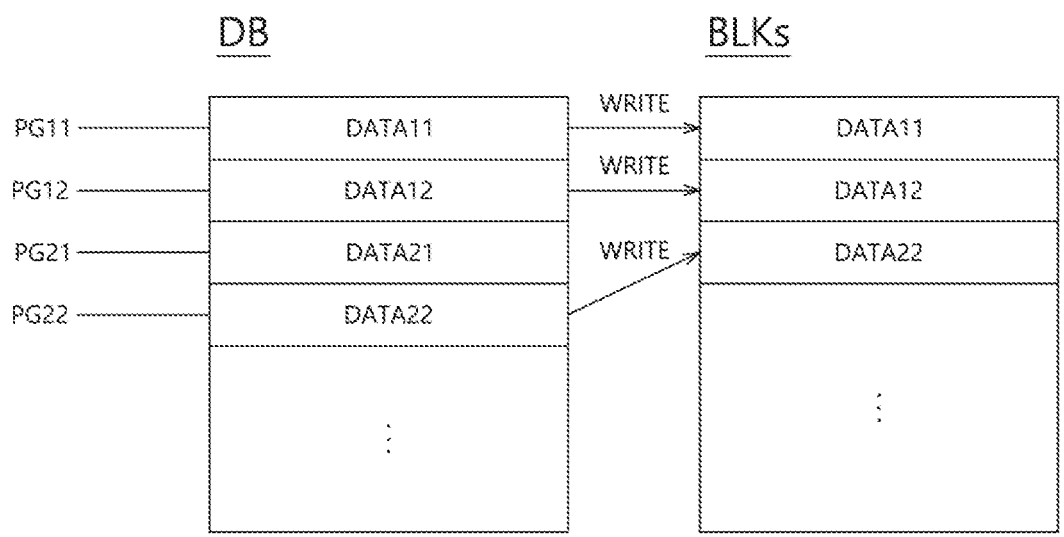
Figure 11A:
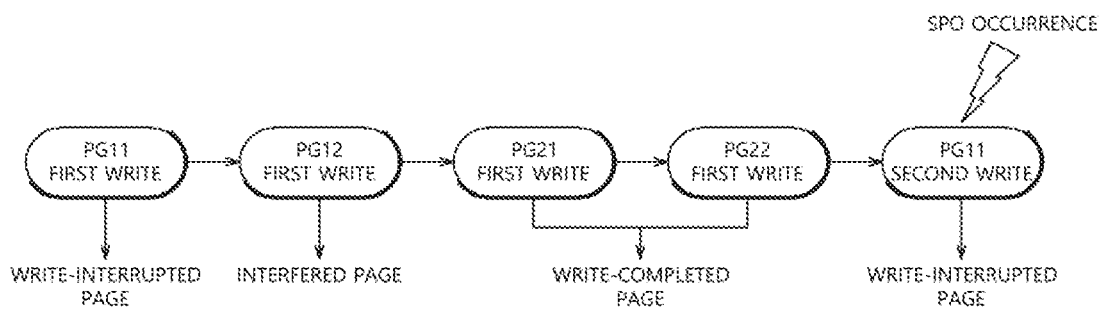
Figure 11B:
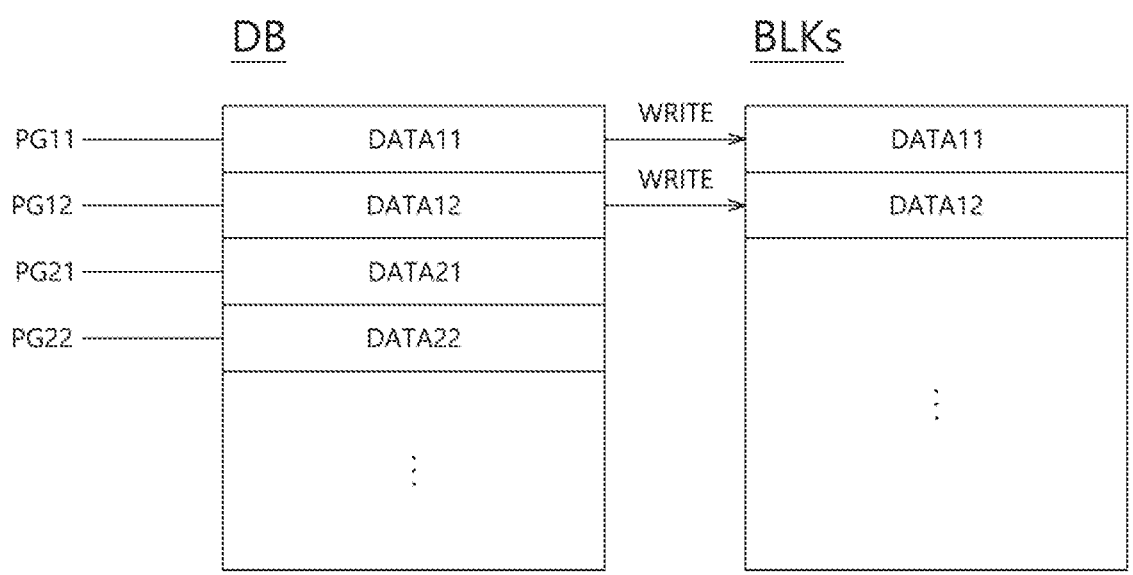
Figure 12B:
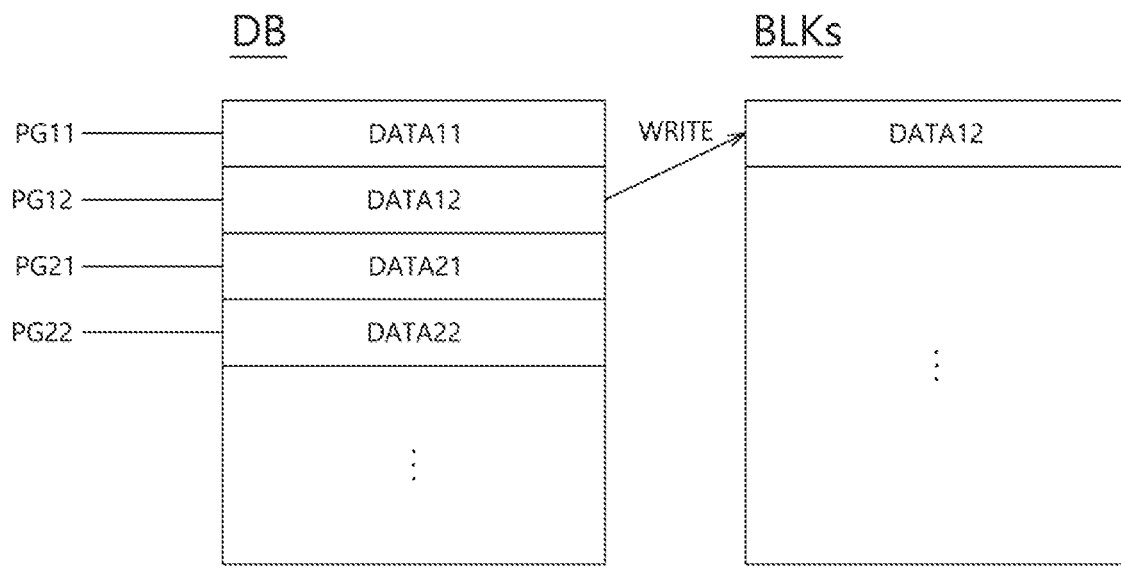

FIGS. 8A to 12B are conceptual diagrams illustrating a method of backing up data temporarily stored in the data buffer DB to a specific memory block BLKs of the nonvolatile memory device 100 under the SPO situation, according to an embodiment. FIGS. 8A and 8B are diagrams illustrating an example in which the SPO occurs during the first write operation for the first-second page PG12 of the first word line WL1. FIGS. 9A and 9B are diagrams illustrating an example in which the SPO occurs during the first write operation for the second-first page PG21 of the second word line WL2. FIGS. 10A and 10B are diagrams illustrating an example in which the SPO occurs during the first write operation for the second-second page PG22 of the second word line WL2. FIGS. 11A and 11B are diagrams illustrating an example in which the SPO occurs during the second write operation for the first-first page PG11 of the first word line WL1. FIGS. 12A and 12B are diagrams illustrating an example in which the SPO occurs during the second write operation for the first-second page PG12 of the first word line WL1. For clarity, the specific memory block BLKs may also be referred to as "the backup memory block BLKs" hereinafter.

When the SPO occurs, the processor 220 of the controller 200 may detect the write-interrupted pages (that is, pages in which write operation has been interrupted), the write-completed pages, and interfered pages (that is, pages in which interference has occurred) from the memory block BLKo that is in use. For example, the processor 220 may determine and detect the write-interrupted pages, the write-completed pages, and interfered pages from the memory block BLKo in use based on information for pages on which the write operation is performed under the SPO situation and information for the write operation.

Figure 8B:
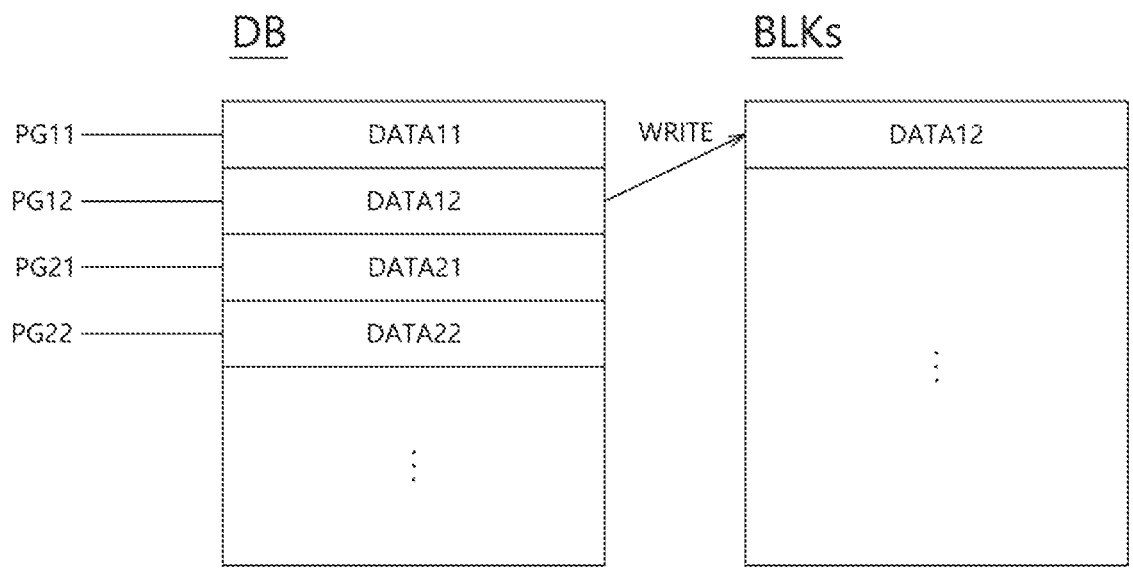

As illustrated in FIG. 8A, when SPO occurs during the first write operation for the first-second page PG12 of the first word line WL1, the processor 220 may determine the first-first page PG11 of the first word line WL1 as the write-completed page and determine the first-second page PG12 as the write-interrupted page. As illustrated in FIG. 8B, based on the determination result, the processor 220 may control the nonvolatile memory device 100 to perform the write operation for storing the first-second data DATA12 corresponding to the first-second page PG12 of the first word line WL1 among data DATA11 to DATA22 temporarily stored in the data buffer DB of the memory 230 in the backup memory block BLKs selected in the nonvolatile memory device 100 while the minimum operating power is provided through the driving of the PLP circuit 240. The first-second data DATA12 may be written in the backup memory block BLKs in a SLC manner, but this is not limited thereto.

Figure 9A:
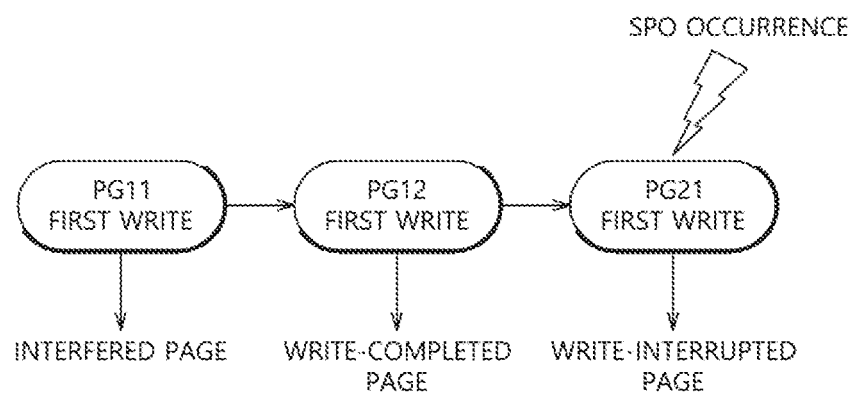

As illustrated in FIG. 9A, when the SPO occurs during the first write operation for the second-first page PG21 of the second word line WL2, the processor 220 may determine the first-first page PG11 of the first word line WL1 as the interfered page, determine the first-second page PG12 of the first word line WL1 as the write-completed page and determine the second-first page PG21 of the second word line WL2 as the write-interrupted page. The processor 220 may determine the first-first page PG11 of a previous word line (for example, the first word line WL1) among word lines close to the second-first page PG21 of the second word line WL2 in the vertical direction (for example, the Z-axis direction) with respect to the second-first page PG21 of the second word line WL2 as the interfered page.

Figure 9B:
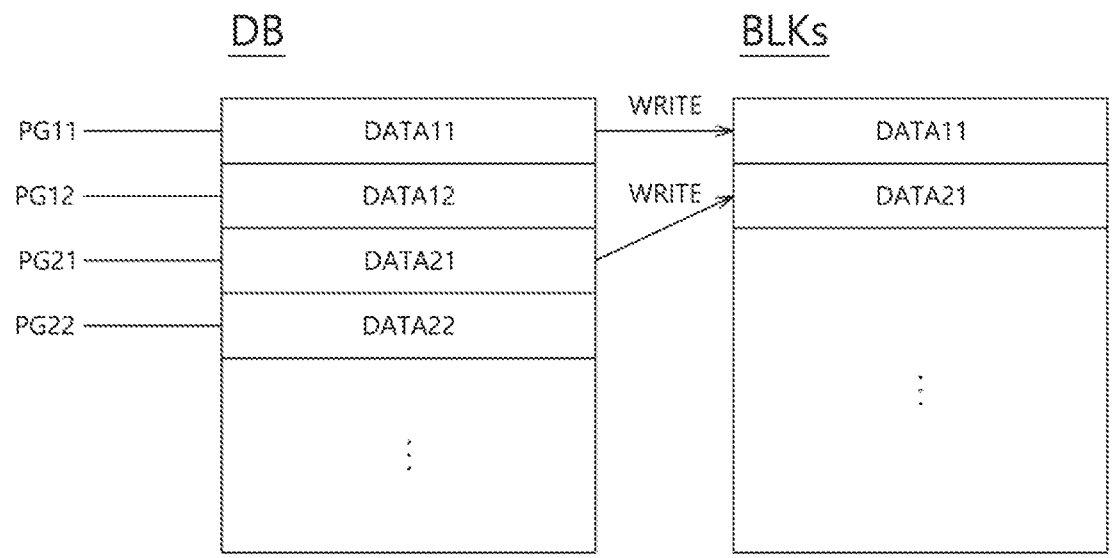

As illustrated in FIG. 9B, based on the determination result, the processor 220 may control the nonvolatile memory device 100 to perform the write operation for storing the first-first data DATA11 corresponding to the first-first page PG11 of the first word line WL11 and the second-first data DATA21 corresponding to the second-first page PG21 of the second word line WL2 among the data DATA11 to DATA22 temporarily stored in the data buffer DB of the memory 230 in the backup memory block BLKs while the minimum operating power is provided through the driving of the PLP circuit 240.

As illustrated in FIG. 10A, when the SPO occurs during the first write operation for the second-second page PG22 of the second word line WL2, the processor 220 may determine the first-first page PG11 and the first-second page PG12 of the first word line WL1 as the interfered pages, determine the second-first page PG21 of the second word line WL2 as the write-completed page, and determine the second-second page PG22 of the second word line WL2 as the write-interrupted page.

As illustrated in FIG. 10B, based on the determination result, the processor 220 may control the nonvolatile memory device 100 to perform the write operation for storing the first-first data DATA11 and the first-second data DATA12 corresponding to the first-first page PG11 and the first-second page PG12 of the first word line WL1 and the second-second data DATA22 corresponding to the second-second page PG22 of the second word line WL2 among the data DATA11 to DATA22 temporarily stored in the data buffer DB of the memory 230 in the backup memory block BLKs while the minimum operating power is provided through the driving of the PLP circuit 240.

As illustrated in FIG. 11A, when the SPO occurs during the second write operation for the first-first page PG11 of the first word line WL1, the processor 220 may determine the first-first page PG11 and the first-second page PG12 of the first word line WL1 as the write-interrupted page and the interfered page, respectively, and determine the second-first page PG21 and the second-second page PG22 of the second word line WL2 as the write-completed pages.

As illustrated in FIG. 11B, based on the determination result, the processor 220 may control the nonvolatile memory device 100 to perform the write operation for storing the first-first data DATA11 and the first-second data DATA12 corresponding to the first-first page PG11 and the first-second page PG12 of the first word line WL1 among the data DATA11 to DATA22 temporarily stored in the data buffer DB of the memory 230 in the backup memory block BLKs while the minimum operating power is provided through the driving of the PLP circuit 240.

As illustrated in FIG. 12A, when the SPO occurs during the second write operation for the first-second page PG12 of the first word line WL1, the processor 220 may determine the first-first page PG11 and the first-second page PG12 of the first word line WL1 as the write-completed page and the write-interrupted page, respectively, and determine the second-first page PG21 and the second-second page PG22 of the second word line WL2 as the write-completed page.

As illustrated in FIG. 12B, based on the determination result, the processor 220 may control the nonvolatile memory device 100 to perform the write operation for storing the first-second data DATA12 corresponding to the first-second page PG12 of the first word line WL1 among the data DATA11 to DATA22 temporarily stored in the data buffer DB of the memory 230 in the backup memory block BLKs while the minimum operating power is provided through the driving of the PLP circuit 240.

In the embodiment, only the partial data corresponding to the write-interrupted page and/or the interfered page among data temporarily stored in the data buffer DB may be stored in the nonvolatile memory device 100 in the SPO and thus the size of the data to be backed up may be reduced.

As the size of the data to be backed up is reduced, the backup of data may be stably completed while the minimum operating power provided through the PLP circuit 240 is maintained. The number of capacitors for providing the minimum operating power may be reduced and the manufacturing cost may be reduced.

Figure 13:
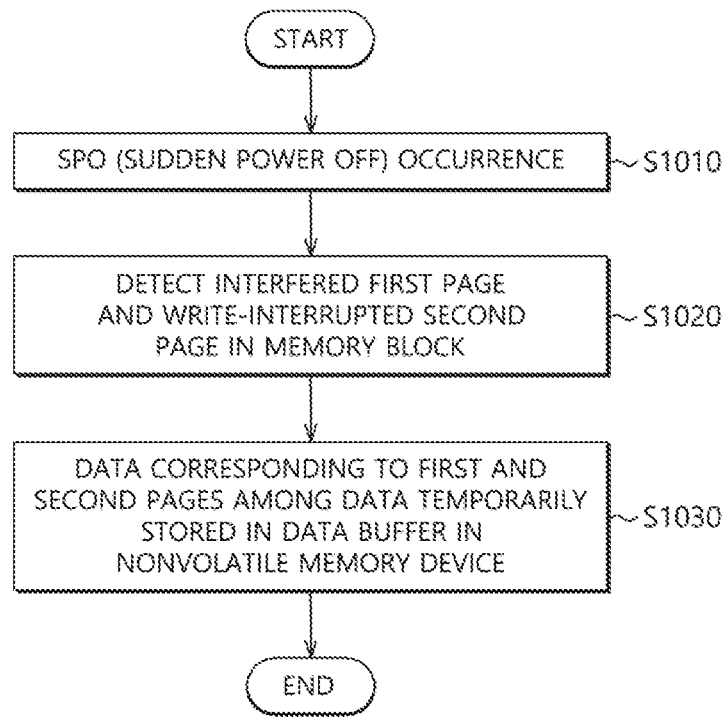
FIG. 13 is a flowchart describing a method of operating a data storage apparatus according to an embodiment of the present disclosure.

FIG. 13 is a flowchart describing a method of operating the data storage apparatus 10 according to an embodiment. The operation method of the data storage apparatus 10 according to the embodiment will be described with reference to FIGS. 1 to 12B.

In operation S1010, the processor 220 of the controller 200 may detect occurrence of SPO. The SPO detection is a known technology in the related art and thus detailed description therefor will be omitted.

When the SPO of the data storage apparatus 10 occurs, the PLP circuit 240 of the controller 200 may be driven through control of the processor 220. The PLP circuit 240 may provide the minimum operating power into the data storage apparatus 10 using the auxiliary power generator 245. The data storage apparatus 10 may be stably terminated according to the providing of the minimum operating power.

In operation S1020, the processor 220 may detect the interfered first page and the write-interrupted second page from the using memory block BLKo. For example, the processor 220 may detect the first page and the second page by determining the write-interrupted page, the write-completed page, and interfered page from the using memory block BLKo based on information for pages on which the write operation is performing under the SPO situation and information for the write operation (for example, the first write operation and the second write operation).

For example, the processor 220 may determine the page on which the write operation is performing under the SPO situation, determine the detected page as the write-interrupted page (for example, the second page), and determine all or a portion of pages coupled to a previous word line close to the detected second page in the vertical direction (for example, Z-axis direction) with respect to the detected second page as the interfered pages. For example, when the detected page is not a last page of the corresponding word line, the processor 220 may detect each page from a firstly programmed page to a page corresponding to the detected page among pages coupled to a previous word line as the first page. When the detected page is the last page of the corresponding word line, the processor 220 may detect each of all the pages coupled to the previous word line as the first page.

In operation S1030, the processor 220 may store data corresponding to the first page and data corresponding to the second page among data temporarily stored in the data buffer DB of the memory 230 in the backup memory block BLKs of the nonvolatile memory device 100.

Figure 14:
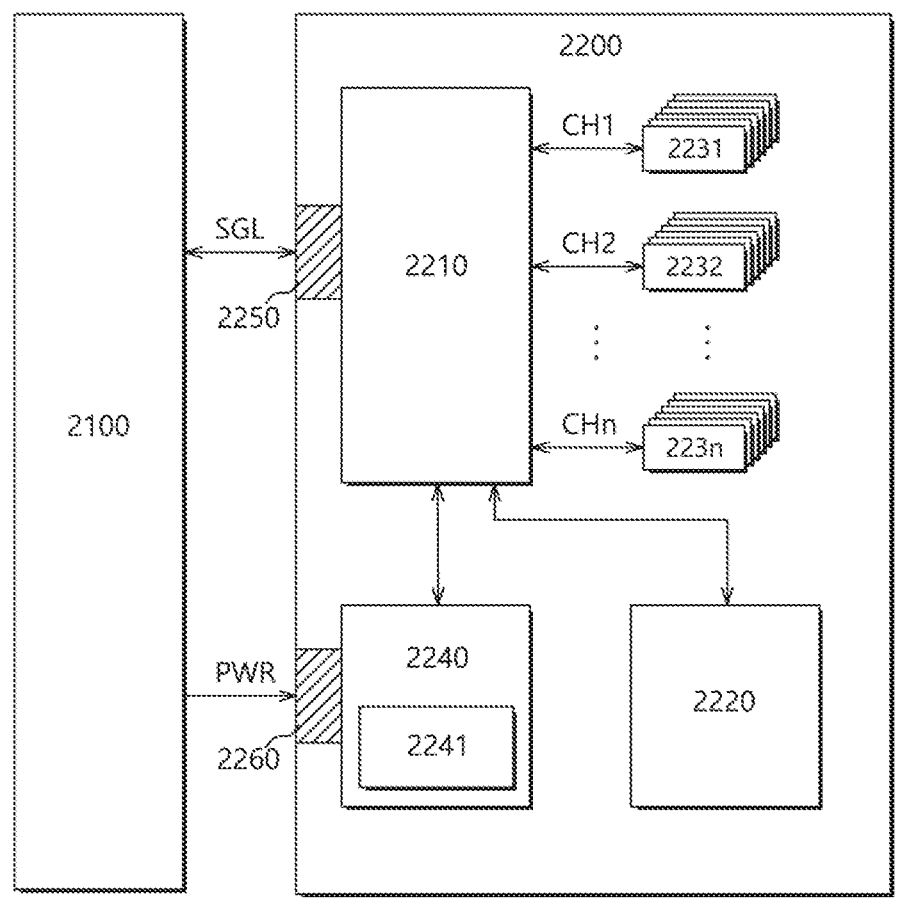
FIG. 14 is a diagram illustrating a data processing system including a solid state drive (SSD) according to an embodiment of the present disclosure.

FIG. 14 is a diagram illustrating a data processing system including a solid state drive (SSD) according to an embodiment. Referring to FIG. 14, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 15:
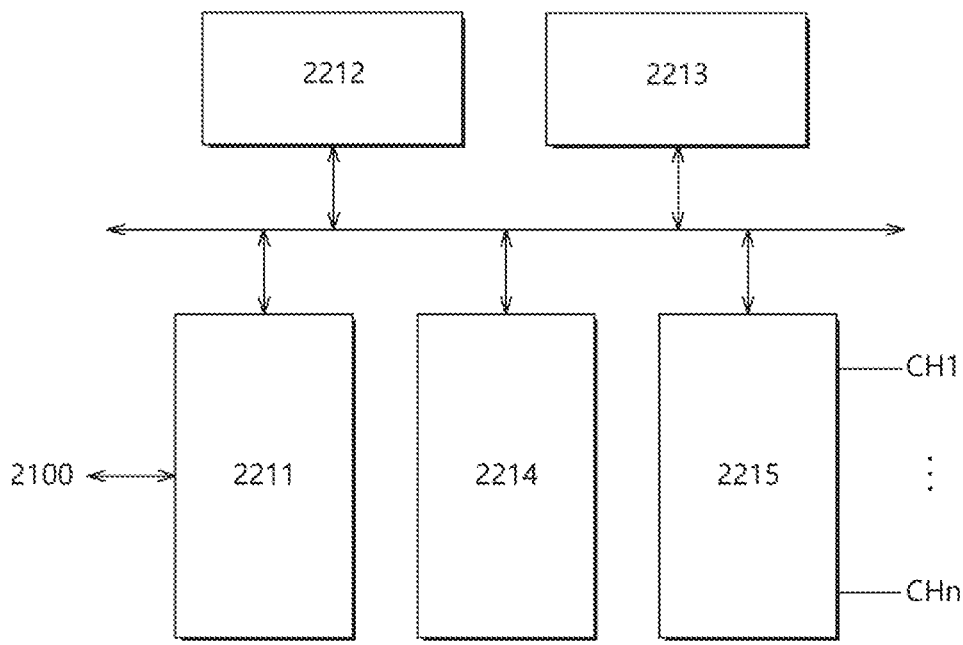
FIG. 15 is a diagram illustrating a controller illustrated in FIG. 14.

FIG. 15 is a diagram illustrating the controller 2210 of FIG. 14. Referring to FIG. 15, the controller 2210 may include a host interface 2211, a controller 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (DATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The controller 2212 may analyze and process the signal SGL input from the host apparatus 2100. The controller 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the controller 2212. The memory interface 2215 may exchange data with the nonvolatile memory devices 2231 to 223n according to control of the controller 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 16:
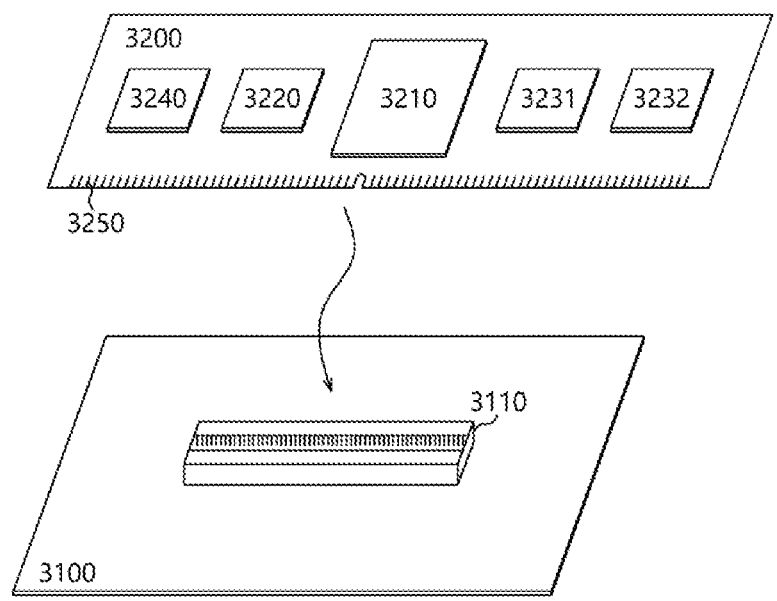
FIG. 16 is a diagram illustrating a data processing system including a data storage apparatus according to an embodiment of the present disclosure.

FIG. 16 is a diagram illustrating a data processing system including a data storage apparatus according to an embodiment. Referring to FIG. 16, a data processing system 3000 may include a host apparatus 3100 and a data storage apparatus 3200.

The host apparatus 3100 may be configured in a board form such as a printed circuit board (PCB). Although not shown in FIG. 16, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 15.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 17:
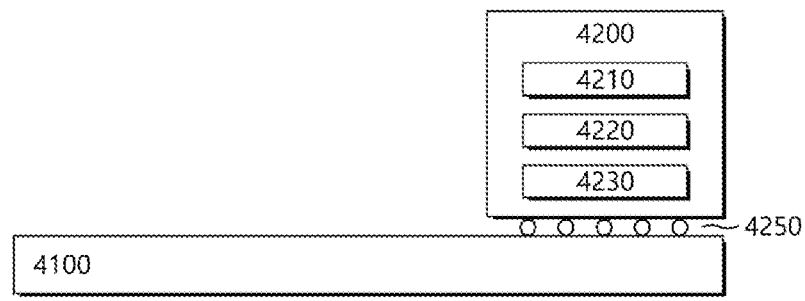
FIG. 17 is a diagram illustrating a data processing system including a data storage apparatus according to an embodiment of the present disclosure.

FIG. 17 is a diagram illustrating a data processing system including a data storage apparatus according to an embodiment. Referring to FIG. 17, a data processing system 4000 may include a host apparatus 4100 and a data storage apparatus 4200.

The host apparatus 4100 may be configured in a board form such as a PCB. Although not shown in FIG. 17, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 15.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 18:
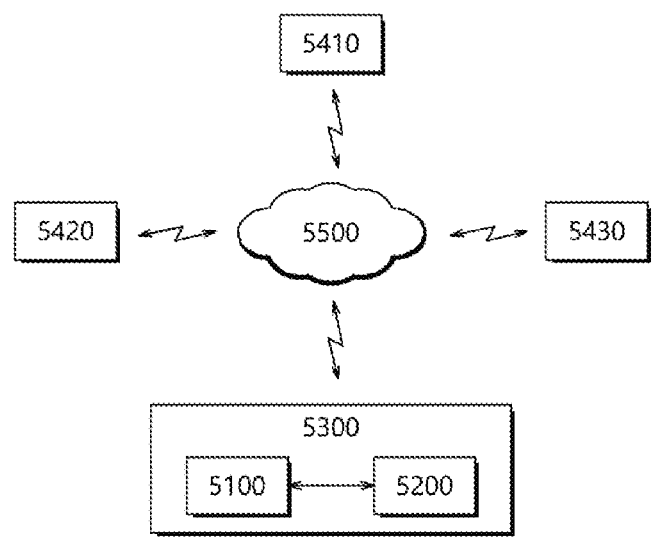
FIG. 18 is a diagram illustrating a network system including a data storage apparatus according to an embodiment of the present disclosure.

FIG. 18 is a diagram illustrating a network system 5000 including a data storage apparatus according to an embodiment. Referring to FIG. 18, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 14, the data storage apparatus 3200 of FIG. 16, or the data storage apparatus 4200 of FIG. 17.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage apparatus comprising:
a nonvolatile memory device including a plurality of memory blocks in which a plurality of word lines to which one or more pages are coupled are arranged;
a data buffer configured to buffer data to be stored in the one or more pages of the nonvolatile memory device; and
a processor configured to perform a write operation on a first word line and then on a second word line adjacent to the first word line, detect, when a sudden power off (SPO) occurs after or during the write operation on the second word line, one or more first pages coupled to the first word line, in which an interference has occurred due to the write operation on the second word line, and selectively store data corresponding to data stored in the one or more first pages, among the data buffered in the data buffer, in a backup memory block of the nonvolatile memory device.

2. The data storage apparatus of claim 1, further comprising a power loss protection (PLP) circuit configured to provide a minimum operating power to the data storage apparatus for a preset time when the SPO occurs.

3. The data storage apparatus of claim 2, wherein the PLP circuit includes an auxiliary power generator configured to generate the minimum operating power.

4. The data storage apparatus of claim 1, wherein the processor detects a second page that is write-interrupted due to the SPO, and controls the nonvolatile memory device to store data corresponding to the second page that is write-interrupted among the data buffered in the data buffer in the backup memory block.

5. The data storage apparatus of claim 1, wherein the plurality of word lines are arranged in a first direction.

6. The data storage apparatus of claim 5, wherein the processor detects a page that is write-interrupted due to the SPO and detects, as the first pages, some or all of the pages among the one or more pages, which are coupled to the first word line adjacent to the second word line to which the detected write-interrupted page is coupled, in the first direction with respect to the second word line.

7. The data storage apparatus of claim 6, wherein the processor detects, as the first pages, all of the pages coupled to the first word line, when the detected write-interrupted page is a last page of the second word line.

8. The data storage apparatus of claim 7, wherein, when a first-first page and a first-second page are coupled to the first word line, a second-first page and a second-second page are coupled to the second word line, and the SPO occurs during a first write operation for the second-second page,
wherein the processor detects, as the first pages, the first-first page and the first-second page of the first word line, and controls the nonvolatile memory device to store data corresponding to data stored in the first-first and first-second pages among the data buffered in the data buffer in the backup memory block.

9. The data storage apparatus of claim 6, wherein the processor detects, as the first pages, pages from a primary page to a page corresponding to the detected write-interrupted page among the pages coupled to the first word line, when the detected write-interrupted page is not the last page of the second word line.

10. The data storage apparatus of claim 9, wherein, when the
plurality of word lines include a first word line and a second word line, a first-first page and a first-second page are coupled to the first word line, a second-first page and a second-second page are coupled to the second word line, and the SPO occurs during a first write operation for the second-first page,
wherein the processor detects, as the first page, the first-first page of the first word line, and controls the nonvolatile memory device to store data corresponding to data stored in the first-first page among the data buffered in the data buffer in the backup memory block.

11. An operating method of a data storage apparatus which includes a nonvolatile memory device including a plurality of memory blocks in which a plurality of word lines to which one or more pages are coupled are arranged and a controller configured to control the nonvolatile memory device, the method comprising:
performing a write operation on a first word line and then on a second word line adjacent to the first word line;

detecting occurrence of sudden power-off (SPO) of the data storage apparatus after or during the write operation on the second word line;

detecting one or more first pages coupled to the first word line, in which an interference has occurred due to the write operation on the second word line; and selectively storing data corresponding to data stored in the one or more first pages, among data buffered in a data buffer, in a backup memory block of a nonvolatile memory device.

12. The method of claim 11, wherein the detecting of the first pages includes:

detecting a second page that is write-interrupted due to the SPO occurrence; and detecting, as the first pages, all or some pages among pages coupled to the first word line adjacent to the second word line to which the second page is coupled in a first direction with respect to the second word line.

13. The method of claim 12, wherein the detecting of the first pages includes, when the second page is a last page of the second word line, detecting all of the pages coupled to the first word line as the first pages.

14. The method of claim 12, wherein the detecting of the first pages includes, when the second page is not the last page of the second word line, detecting pages from a primary page to a page corresponding to the second page among the pages coupled to the first word line as the first pages.

15. The method of claim 12, wherein the storing of the data in the backup memory block includes storing data corresponding to the second page among the data buffered in the data buffer in the backup memory block.

16. The method of claim 11, further comprising, after the occurrence of the SPO, providing a minimum operating power for a preset time to the data storage apparatus.

17. The method of claim 16, wherein the storing of the data corresponding to data stored in the first pages in the backup memory block is performed while the minimum operating power is being provided.

18. A memory system comprising:

a memory block including page planes arranged in a first direction, each coupled to a word line and each having pages arranged in a second direction, each page having quadruple level cells (QLCs) arranged in a third direction; and a controller configured to selectively back up, when a sudden power off (SPO) occurs during a program operation to the memory block, buffered data to be programmed into one or more pages between interrupted and interfered pages of the memory block, wherein the interrupted page is a page to which the program operation is interrupted due to the SPO, and wherein the interfered page is a page within a page plane, which is arranged adjacent to a page plane of the interrupted page, in which a program operation was completed before the interrupted program operation and stored data was damaged due to the program operation being performed on the page plane of the interrupted page.

\* \* \* \* \*